(12) United States Patent
Clements et al.

(10) Patent No.: US 6,616,252 B2
(45) Date of Patent: Sep. 9, 2003

(54) PERMANENTLY ATTACHED RACKMOUNT HANDLES AND SPACING BRACKETS

(75) Inventors: Bradley E Clements, Ft Collins, CO (US); Paige Ringdahl, Fort Collins, CO (US); Brandon Rubenstein, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/918,669

(22) Filed: Jul. 30, 2001

(65) Prior Publication Data

US 2003/0020380 A1 Jan. 30, 2003

(51) Int. Cl.[7] .................................. H05K 7/18
(52) U.S. Cl. .................................. 312/223.2
(58) Field of Search ............... 312/244, 223.1, 312/223.2; 211/26; 361/724, 725, 727

(56) References Cited

U.S. PATENT DOCUMENTS

| | | | | |
|---|---|---|---|---|
| 3,988,802 A | * | 11/1976 | Bruni et al. ................. | 16/405 |
| 4,014,598 A | * | 3/1977 | Stalley et al. ............... | 165/121 |
| 4,237,590 A | * | 12/1980 | Work ........................... | 27/2 |
| 4,589,162 A | * | 5/1986 | Manz et al. .................. | 16/429 |
| 4,681,381 A | * | 7/1987 | Sevey .......................... | 312/333 |
| 5,277,615 A | * | 1/1994 | Hastings et al. ............ | 361/685 |
| 5,845,978 A | * | 12/1998 | Jung ............................ | 16/405 |
| 5,931,550 A | * | 8/1999 | Chen ........................... | 312/223.2 |
| 5,959,841 A | * | 9/1999 | Allen et al. ................. | 312/223.2 |
| 5,971,506 A | * | 10/1999 | Dubin ......................... | 312/223.2 |
| 6,036,288 A | * | 3/2000 | Shih ............................. | 248/918 |
| 6,262,894 B1 | * | 7/2001 | Nelson et al. ............... | 312/223.2 |
| 6,297,962 B1 | * | 10/2001 | Johnson et al. .............. | 248/535 |
| 2003/0015947 A1 | * | 1/2003 | Chen et al. .................. | 312/223.2 |

* cited by examiner

Primary Examiner—Janet M. Wilkens

(57) ABSTRACT

A chassis for use in housing heavy electrical equipment is provided with lifting devices for attachment of the chassis to a telescoping rail assembly, such as may be found on a conventional EIA equipment rack. The chassis includes a housing with a sidewall having a recessed wall to which handles and support brackets are permanently attached. The handles are hingedly connected to the recessed wall and may be pivoted over an arc between an extended position that is suitable for lifting operations and a retracted position adjacent the recessed wall. The support brackets may be selectively rotated between an assembly position that supports the chassis atop the telescoping rail assembly and a position of normal use that does not interfere with depthwise extensile and de-extensile motion of the telescoping rail assembly and chassis.

9 Claims, 4 Drawing Sheets

PERMANENTLY ATTACHED RACKMOUNT HANDLES AND SPACING BRACKETS

BACKGROUND OF THE INVENTION

1. Field of the Invention

The invention pertains to the field of housings and rack systems for the storage and positioning of electrical equipment and, more particularly, to devices having chassis attached handles that facilitate team lifting of chassis that contain heavy electrical equipment.

2. Discussion of the Related Art

It is common practice to deploy advanced electronics systems in racks, such as standard Electronic Industries Association (EIA) equipment racks. The EIA racks are conventionally found and used in research and development operations, as well as commercial operations, and generally comprise a series of bays that permit the stacking of components one atop the other. Roller slides are used to hold instruments in stacked arrangement and while facilitating removal or movement of each unit out of alignment for replacement, servicing and/or modification.

U.S. Pat. No. 5,505,533 discloses a rackmount chassis that adapts a standard personal computer for rack usage by encapsulating the personal computer. A handle is built into the side of the chassis for lifting of the assembly. The handle is formed of a dual-pivoting assembly in which the grasping portion of the handle that pivots on its axis of elongation. At least four pivoting operations are required to deploy the handle for lifting operations. Due to the positioning of his handle, the lifting operations are ergonomically incorrect, as the lifter's lifting strength and grip are significantly weakened due to the twisting and bending motion of the wrist. This weakening occurs because the lifter's hand must engage the side-mounted handle in a handshake configuration as the lifter pushes the chassis forward.

Handles for lifting of electronic equipment cease to be a mere convenience and become a necessity when heavier items are being installed. For example, network server packages can weight from one hundred to five hundred pounds (45 to 230 kilograms). Team lifting of these heavier items is a necessity. In some instances, the chassis that is being lifted contains handholds that facilitate lifting. These handholds impose a burden that the wrists of the lifters are not optimally aligned with the chassis, and create a significant risk of injury to the lifters and damage to the equipment. In other instances, handles are temporarily attached to the chassis. These handles are removed after the equipment is installed, and it is a significant inconvenience that the handles often cannot be found when it is time to remove the chassis from the rack or to reposition the chassis in the rack. When the handles cannot be found, the lifters normally attempt to move the chassis without the handles. Again, there is significant risk of injury to the lifters or equipment damage in the attempt to move the chassis with improper lifting equipment.

There remains a need to provide lifting devices that remain attached to a chassis for electrical equipment when the equipment resides in an equipment rack, where the devices may be selectively deployed for lifting operations in positions that are ergonomically correct for team-lifting purposes.

SUMMARY OF THE INVENTION

The present invention overcomes the problems that are outlined above by providing lifting devices that remain attached to a chassis for electrical equipment when the equipment resides in an equipment rack. The devices may be selectively deployed for lifting operations in positions that are ergonomically correct for team-lifting purposes.

The chassis in its preferred embodiments houses electrical equipment that is coupled to an equipment rack. The entire package including the chassis and the electrical equipment may, for example, weigh several hundred pounds, in which case the lifting devices are amenable to team-lifting applications.

The preferred chassis comprises a housing that is configured for internally retaining electrical components in operable condition, such as the various printed circuit boards, power supplies, cell boards, and fan cooling systems in a telecommunications server. The housing presents dimensions of height, width, and depth. At least one handle is connected to the housing and includes a first end and a second end distal from the first end. A telescoping rail assembly is coupled with the housing for extensile and de-extensile motion of the housing in the depth dimension. A pivot assembly includes a pivot-mounting bracket that is coupled with the housing, and a pivot linkage, such as a hinge pin, that couples the pivot-mounting bracket with the first end of the handle to permit pivoting of the second end across an arc. The pivot linkage permits the first end of the handle to travel a greater distance across the arc than does the second end, so that handle positioning along the arc comprises a retracted position where the second end resides adjacent the housing and an extended position where the second end resides away from the housing to occupy a greater width dimension than does the second end at the retracted position.

In particularly preferred embodiments, the housing comprises a sidewall having a recessed portion and a non-recessed portion of relatively greater width than the recessed portion. The pivot-mounting bracket and the telescoping rail assembly are both attached to the recessed portion. Thus, the second end of the handle in the retracted position occupies a position that does not interfere with depthwise extensile and de-extensile motion of the telescoping rail assembly.

A support bracket may be used to support the chassis while the telescoping rail assembly is being attached to the electrical equipment rack. The support bracket includes a wall segment that is rotatably fastened to the housing, and a wing extending from the support wall. In one configuration, the support bracket occupies an assembly support position above the telescoping rail assembly for support of the chassis during assembly of the telescoping rail assembly to the chassis. After attachment is complete, the support bracket may be selectively rotated into a position of normal use where the wing does not interfere with extensile and de-extensile motion of the telescoping rail assembly.

Additional handles and support brackets as are described above, may be provided, as needed to facilitate team lifting operations. For example, a total of three additional handles may be positioned on the chassis for team-lifting purposes.

A method of using the structures that are described above comprises the steps of providing the structures, pivoting the handle to the second position; lifting the housing through use of the handle, placing the wing of the support bracket on the electrical equipment rack for support of the housing, attaching the telescoping slide assembly to the electrical equipment rack, and repositioning the support bracket on the housing to a position that does not interfere with depthwise translation of the chassis due to extensile and de-extensile motion of the housing in the depth dimension.

DETAILED DESCRIPTION OF THE EMBODIMENTS

Figure 1:
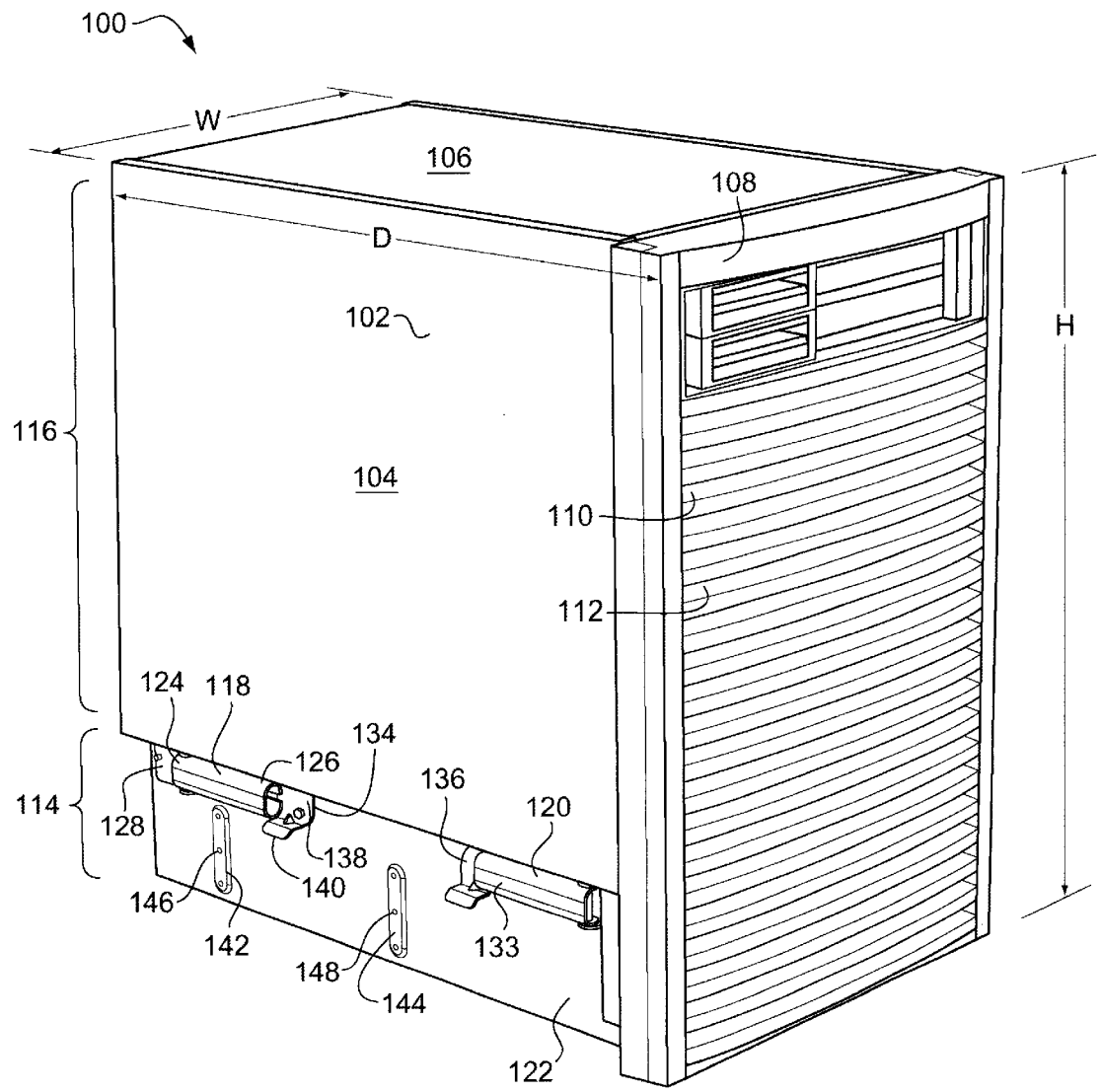
FIG. 1 depicts a top left front perspective view of a chassis that incorporates lifting devices according to a particularly preferred embodiment.
Figure 1A:
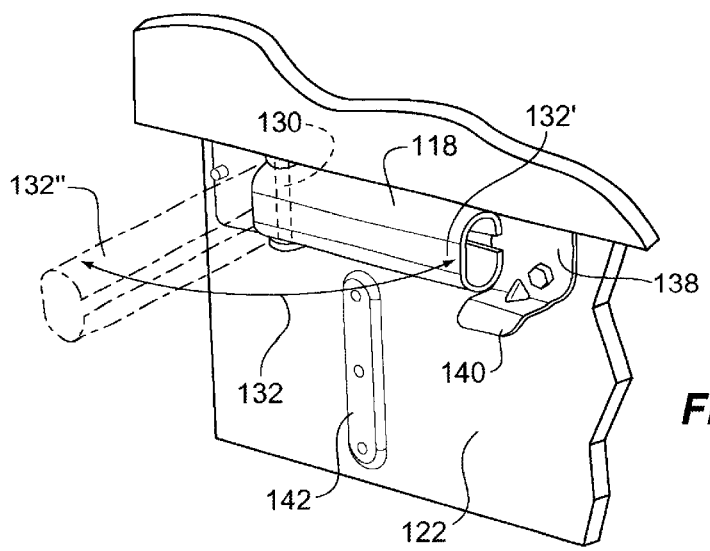
FIG. 1A is a perspective view showing a portion of FIG. 1 in greater detail.

FIG. 1 depicts a chassis 100 that embodies preferred instrumentalities of the general concepts disclosed herein. The chassis 100 includes a housing 102 in the general form of a rectangular box having at least a sidewall 104, a top wall 106, and a hinge-mounted door 108 including a plurality of air vents, e.g., vents 110 and 112. Internal to the housing and not shown in FIG. 1 are any number of conventional electrical components, such as a motherboard, cell boards, power supplies, and fan cooling systems, that combine in operation to provide an intended system functionality. This system may provide any functionality for any type of equipment that resides on an electrical equipment rack, such as a computer, a telecommunications server, or electrical test equipment. The combined weight of chassis 100 and its internal components may be 100 to 500 pounds or more. Housing 102 includes recessed portion 114 and a non-recessed portion 116 of relatively greater width than the recessed portion 114.

A pair of tubular handles 118 and 120 are attached to a recessed wall 122 in the recessed portion 114. The handles 118 and 120 are identical to one another, and each has an ovaloid cross-section that is elongated in the vertical direction. This cross-section improves the handle strength while also advantageously narrowing the handle width. Handle 118 has a first end 124 and a second end 126. A pivot-mounting bracket 128 is attached to the recessed wall 122. A vertical hinge pin 130 forms a pivot linkage that connects the pivot mounting bracket 128 with the handle 118. The hinge pin 130 restrains the first end 124 of handle 118 and permits the second end 126 of handle 118 to travel through an arc 132 between a retracted position 132' adjacent the recessed wall 122 and an extended position 132" that is substantially perpendicular to the recessed wall 122. In this extended position, the handle is positioned in an ergonomically correct manner that facilitates procurement of a strong grip, as well as greater lifting strength due to positioning of the lifter's wrist in generally unpronated form during the normal course of lifting operations in the intended environment of use. The exterior gripping surfaces, such as surface 133 of handle 120, are preferably powder-coated to enhance the feel and gripability of these surfaces during lifting operations.

A pair of identical support brackets 134 and 136 are used to support the weight of chassis 100 during attachment of chassis 100 to a conventional electrical equipment rack (not shown). As in the case of support bracket 134, the support brackets each include a wall segment 138 that is attached to recessed wall 122 and a concave-down wing 140 extending outwardly in an "L" shape. A pair of ovaloid bosses 142, 144 contain threaded apertures, such as apertures 146 and 148, respectively, which are used to attach a telescoping rail assembly 200, as shown in FIG. 2.

Figure 2:
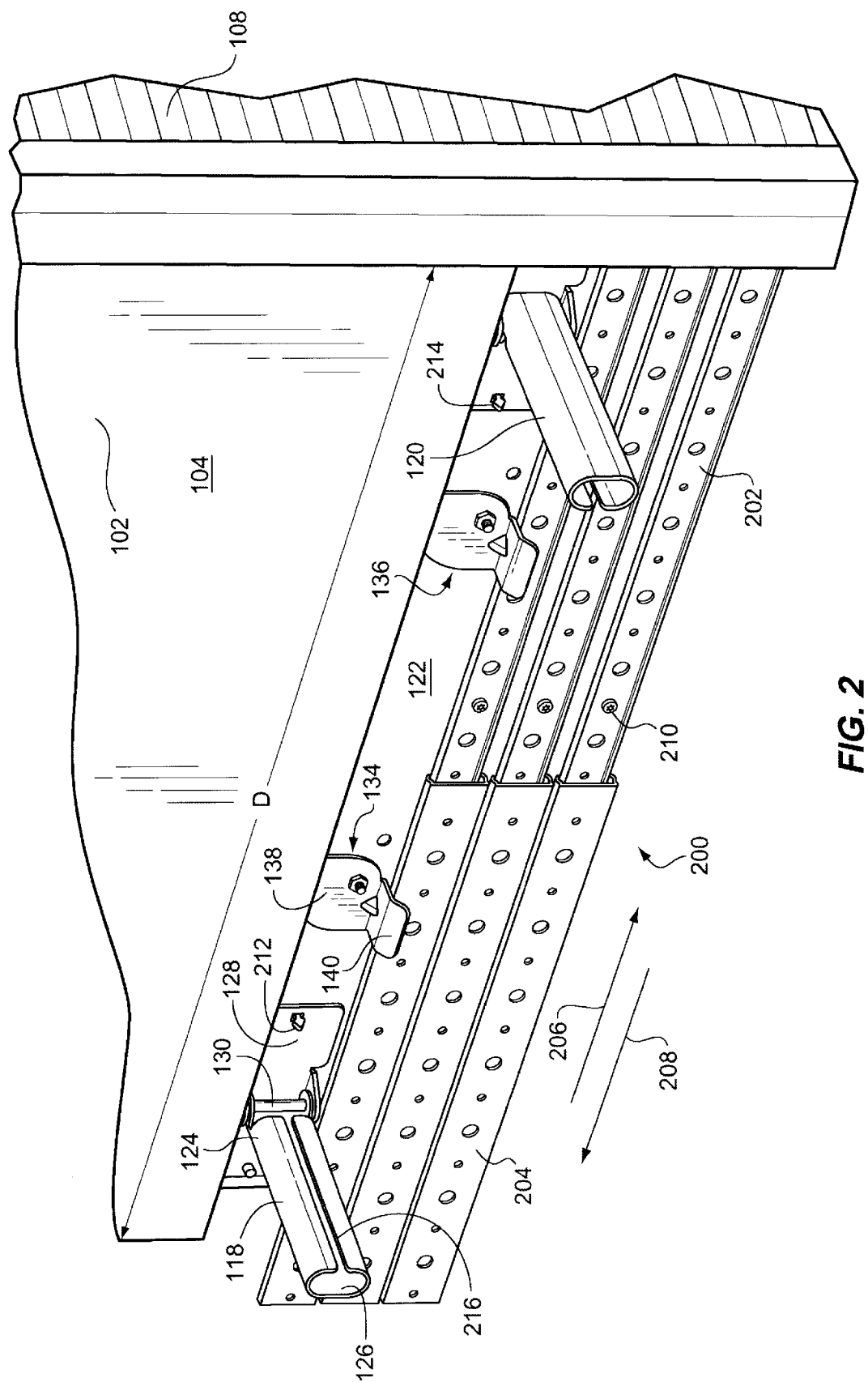
FIG. 2 depicts a portion of the chassis shown in FIG. 1, where handles mounted to the chassis are deployed in an extended position for lifting operations and the chassis is attached to a telescoping rail assembly.

FIG. 2 depicts the recessed wall 122 attached to the telescoping rail assembly 200, which may be a conventional telescoping rail assembly of the type used in EIA racks. The telescoping rail assembly 200 includes a generally flat male member 202 and a complimentary female member 204 that slidingly mate for depthwise extensile motion in direction 206 and depthwise de-extensile motion in direction 208. The telescoping rail assembly 200, as shown in FIG. 2, covers the bosses 144 and 146 that are shown in FIG. 1. The male member 202 is bolted to the bosses 144 and 146, e.g., through the use of bolt 210, which is received in the aperture 148 shown in FIG. 1. As shown in FIG. 2, the handles 118 and 120 have been pivoted to an extended position where, for example, the second end 126 of handle 118 occupies a greater width dimension than does the telescoping rail assembly 200.

The wings of support brackets 134 and 136, such as wing 140, occupy a position above the telescoping rail assembly 200. In this position, which is hereby defined to be an assembly support position, the wing 140 contacts telescoping rail assembly 200 for support of the chassis 100 as the telescoping rail assembly is attached to the chassis 100, for example, by insertion of bolt 210.

Handles 118 and 120, as shown in the retracted position of FIG. 1, permit depthwise extensile and de-extensile motion of the telescoping rail assembly 200 because the handles 118 and 120 in this position do not extend a sufficient distance widthwise to abut, for example, EIA rack structure standing in support of the telescoping rail assembly 200. In contrast, handles 118 and 120 shown in the extended position of FIG. 2 would encounter interference from EIA rack structure standing in support of the telescoping rail assembly 200 upon depthwise extensile and de-extensile motion of the telescoping rail assembly 200. This problem is eliminated under conditions of normal use by the provision of clip spring assemblies, such as spring clip assemblies 212 and 214, which respectively insert into longitudinal slots, such as slot 216, to retain their corresponding handles 118 and 120 in the retracted position of FIG. 1.

Figure 3:
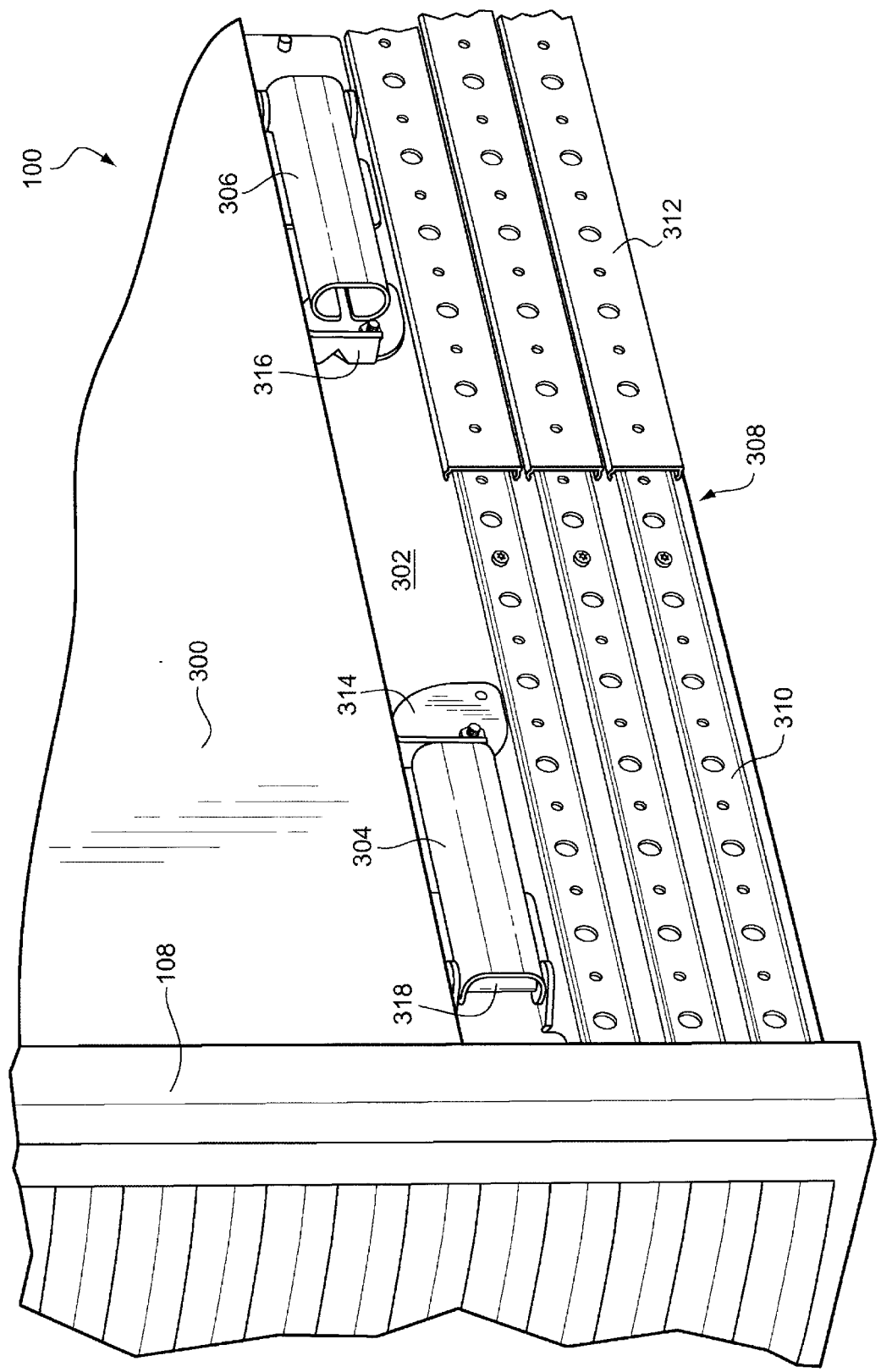
FIG. 3 depicts another portion of the chassis shown in FIG. 1, where handles mounted to the chassis are deployed in a retracted position that does not interfere with extensile and de-extensile motion of the telescoping rail assembly.

FIG. 3 depicts a portion of second sidewall 300 that forms a mirror image of sidewall 104 including a recessed wall 302. Handles 304 and 306 are identical to handles 118 and 120, which are shown in FIG. 1. A telescoping rail assembly 308 including male member 310 and female member 312 identically compliments the telescoping rail assembly 200 of FIG. 2. Support brackets 314 and 316 are identical to support brackets 134 and 136, however, the support brackets 314 and 316 have been rotated to a position of normal use, as shown below in greater detail by FIGS. 4 and 5. A hinge pin 318 provides a pivot axis for handle 304.

The handles 304 and 306, in like manner with their complimentary handles 118 and 120, are selectively positioned for use in team lifting operations. Thus, for example, the handles 304 and 306 may be separated by a distance of at least about twenty-two inches, which permits a lifter to position his or her body between the handles. Handle 304 is preferably positioned in direct alignment across from handle 120, and handle 306 is directly across from handle 118 for balancing of chassis 100 during lifting operations.

Figure 4:
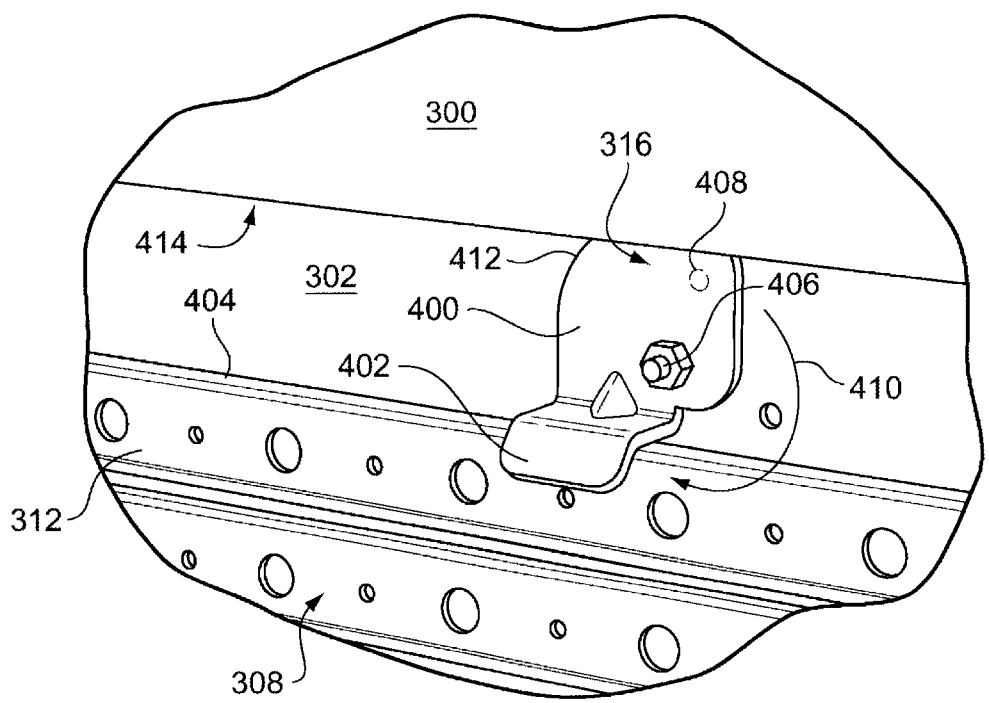
FIG. 4 depicts a perspective view of a support bracket for assembly support use on the chassis.
Figure 5:
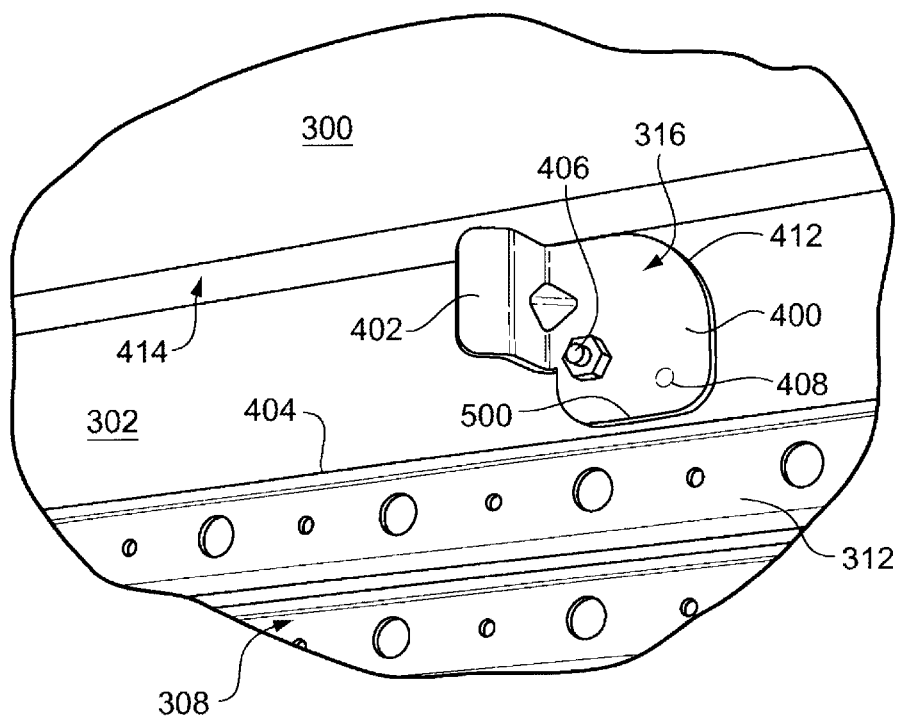
FIG. 5 depicts the support bracket of FIG. 4 rotated to a position of normal use that does not interfere with extensile and de-extensile motion of the telescoping rail assembly.

FIG. 4 provides additional information concerning the support bracket 316 and rotation thereof. As shown in FIG. 4, the support bracket 316 occupies an assembly support position, as previously defined, above the female member 312 of telescoping rail assembly 308. A wall segment 400 adjoins a concave-down wing 402, which contacts the upper surface 404 of female member 312. A bolt 406 pierces wall segment 400 for retention of the support bracket 316 upon recessed wall 302. Wall segment 400 contains a stamped nib 408 pressing into corresponding structure in recessed wall 302, which imparts depthwise lateral stability to support bracket 316. Bolt 406 may be unscrewed to permit selective rotation of support bracket 408 using bolt 406 as an axis of rotation in the clockwise direction of arrow 410. Wall segment 400 has a rounded corner 412 that permits such rotation without abutment between corner 412 and overhang 414. FIG. 5 depicts bracket 316 after rotation into a position of normal use after attachment of male member 310 to chassis 100. The support bracket 316 has been rotated 90° to position edge 500 a sufficient distance above telescoping rail assembly 308, such that edge 500 does not interfere with extensile and de-extensile motion of the telescoping rail assembly 308.

The foregoing discussion is intended to illustrate the concepts of the invention by way of example with emphasis upon the preferred embodiments and instrumentalities. Accordingly, the disclosed embodiments and instrumentalities are not exhaustive of all options or mannerisms for practicing the disclosed principles of the invention. The inventors hereby state their intention to rely upon the Doctrine of Equivalents in protecting the full scope and spirit of the invention.

What is claimed is:

1. A rack-mountable chassis for use in housing electrical equipment, comprising:
    a housing configured for internally retaining electrical components in interoperable condition,
    the housing presenting dimensions of height, width, and depth;
    a telescoping rail assembly coupled with the housing for extensile and de-extensile motion of the housing in the depth dimension;
    at least one handle including a first end and a second end distal from the first end;
    a pivot assembly including
        a pivot-mounting bracket coupled with the housing, and
        a pivot linkage coupling the pivot-mounting bracket with the first end of the handle to permit pivoting of the second end across an arc wherein the second end travels to a greater width dimension across the arc than does the first end,
    the arc comprising a pathway for motion of the handle in the depth and width dimensions between a retracted position where the second end resides adjacent the housing and an extended position where the second end resides away from the housing.

2. The chassis of claim 1, wherein the second end of the handle in the retracted position occupies a lesser width dimension that permits extensile and de-extensile motion of the telescoping rail assembly, and the second end in the extended position occupies a greater width dimension.

3. The chassis of claim 1, wherein the housing comprises a sidewall having a recessed portion and a non-recessed portion of relatively greater width than the recessed portion, the pivot-mounting bracket and the telescoping rail assembly both being attached to the recessed portion.

4. The chassis of claim 1, further comprising a support bracket including a wall rotatably fastened to the housing and a wing extending from the wall to an assembly support position above the telescoping rail assembly, the wing in the assembly support position being operable for support of the chassis on the telescoping rail assembly during attachment of the telescoping rail assembly to the chassis.

5. The chassis of claim 4, wherein the support bracket has dimensions that permit selective rotation of the support bracket into a normal use position where the support bracket does not interfere with extensile and de-extensile motion of the telescoping rail assembly.

6. The chassis of claim 1 comprising a total of three additional handles identical to the handle, the handle and the three additional handles being selectively positioned for use in team-lifting of the chassis.

7. A method of mounting a chassis to a telescoping rail assembly, the method comprising the steps of:
    providing, in combination,
        a housing configured for internally retaining electrical components in interoperable condition,
        the housing presenting dimensions of height, width, and depth,
        at least one handle including a first end and a second end distal from the first end,
        a telescoping rail assembly coupled with the housing for extensile and de-extensile motion of the housing in the depth dimension,
        a pivot assembly including;
            a pivot-mounting bracket coupled with the housing,
            a pivot linkage coupling the pivot-mounting bracket with the first end of the handle to permit pivoting of the second end across an arc wherein the second end travels a greater distance across the arc than does the first end,
            the arc comprising a retracted position where the second end resides adjacent the housing and an extended position where the second end resides away from the housing to occupy a greater width dimension than does the second end at the retracted position, and
            a support bracket including a wall segment rotatably fastened to the housing and a wing extending from the wall segment to an assembly position occupying a greater width dimension than the telescoping rail assembly, the wing in the assembly position being operable for support of chassis during attachment of the telescoping rail assembly to the housing;
    pivoting the handle to the extended position;
    lifting the housing through use of the handle;
    placing the wing of the support bracket on the telescoping rail assembly for support of the housing;
    attaching the telescoping slide assembly to the housing; and
    repositioning the support bracket on the housing to a position that does not interfere with depthwise translation of the chassis due to extensile and de-extensile motion of the housing in the depth dimension.

8. A rack-mountable chassis for use in housing electrical equipment, comprising:
    a housing configured for internally retaining electrical components in interoperable condition,
    the housing presenting dimensions of height, width, and depth;

at least one handle including a first end and a second end distal from the first end;

a pivot assembly including
- a pivot-mounting bracket coupled with the housing, and
- a pivot linkage coupling the pivot-mounting bracket with the first end of the handle to permit pivoting of the second end across an arc wherein the second end travels a greater distance across the arc than does the first end, the arc comprising a retracted position where the second end resides adjacent the housing and an extended position where the second end resides away from the housing to occupy a greater width dimension than does the second end at the retracted position;

a telescoping rail assembly coupled with the housing for extensile and de-extensile motion of the housing in the depth dimension; and a support bracket including a wall rotatably fastened to the housing and a wing extending from the wall to an assembly support position above the telescoping rail assembly, the wing in the assembly support position being operable for support of the chassis on the telescoping rail assembly during attachment of the telescoping rail assembly to the chassis.

9. The chassis of claim 8, wherein the support bracket has dimensions that permit selective rotation of the support bracket into a normal use position where the support bracket does not interfere with extensile and de-extensile motion of the telescoping rail assembly.

* * * * *